United States Patent
North et al.

(10) Patent No.: US 6,637,502 B1
(45) Date of Patent: Oct. 28, 2003

(54) HEAT SINK WITH CONVERGING DEVICE

(75) Inventors: Mark T. North, Lancaster, PA (US);
Steven E. Koffs, King of Prussia, PA (US)

(73) Assignee: Thermal Corp., Stanton, DE (US)

( * ) Notice: Subject to any disclaimer, the term of this patent is extended or adjusted under 35 U.S.C. 154(b) by 64 days.

(21) Appl. No.: 10/123,843

(22) Filed: Apr. 16, 2002

(51) Int. Cl.[7] ................................................ H05K 7/20
(52) U.S. Cl. ...................... 165/80.3; 165/185; 165/121; 361/697; 361/704
(58) Field of Search ................................ 165/80.3, 185, 165/121; 361/697, 704, 710; 174/16.3; 257/719, 722

(56) References Cited

U.S. PATENT DOCUMENTS

| 4,463,569 | A | * | 8/1984 | McLarty ........................ 62/3.2 |
| 5,002,123 | A | * | 3/1991 | Nelson et al. ............... 165/147 |
| 5,597,035 | A | * | 1/1997 | Smith et al. ................ 165/80.3 |
| 5,615,084 | A | | 3/1997 | Anderson et al. ............ 361/697 |
| 5,705,854 | A | * | 1/1998 | Atarashi et al. ............. 257/721 |
| 5,810,072 | A | * | 9/1998 | Rees et al. .................. 165/80.3 |
| 5,828,549 | A | * | 10/1998 | Gandre et al. .............. 361/695 |
| 5,896,917 | A | | 4/1999 | Lemont et al. ............ 165/80.3 |
| 5,957,194 | A | | 9/1999 | Azar .......................... 165/80.3 |
| 6,161,610 | A | | 12/2000 | Azar .......................... 165/80.3 |
| 6,166,904 | A | | 12/2000 | Kitahara et al. ............. 361/697 |
| 6,478,082 | B1 | * | 11/2002 | Li ............................... 165/185 |

* cited by examiner

Primary Examiner—Allen Flanigan
(74) Attorney, Agent, or Firm—Duane Morris LLP

(57) ABSTRACT

A cooling system has a heat sink having a plurality of fins. A fan is positioned near the heat sink to blow air between the fins. A flow converging device is positioned between the fins and the fan, to cause air from the fan to converge on a predetermined region of the heat sink. The flow converging device may be, for example, a plurality of wedges or a body having a frustum shaped opening through the body.

12 Claims, 4 Drawing Sheets

US 6,637,502 B1

HEAT SINK WITH CONVERGING DEVICE

FIELD OF THE INVENTION

The present invention relates to thermal control systems generally, and more specifically to flow control structures for air cooled devices.

BACKGROUND OF THE INVENTION

Thermal control systems are necessary to prevent overheating of computer processors. Most processors in modern desktop computers require a heat sink with forced air convection. For example, a conventional heat sink for a "PENTIUM 4" processor has a flat, solid base plate to which a plurality of fins are affixed. A small fan is placed on top of the fin stack, such that a flow of air is directed downward through the fin structure towards the flat plate. The bottom of the flat plate is placed on the heat source to be cooled, i.e., the computer CPU. The air flow impinges on the base plate inside the fin structure and splits into two flows which exit on two opposing sides of the heat sink.

The most common fans used for this purpose are of the axial type, including a central hub, through which air does not flow. This creates an air flow having an outer region with a relatively high air velocity, and an inner region with a relatively low (or zero) air velocity. Thus, there is a relatively large region directly along the axis of the fan, in which the air moves slowly. The slow moving air creates a region of poor heat transfer. With little air impinging on the central region, heat must be conducted laterally through the heat sink to the outer region, where the air flow and heat removal are greater. Unfortunately, the fan is typically located right over the heat source (i.e., the CPU), so that the region of poorest heat transfer is located right above the heat source.

U.S. Pat. No. 5,615,084 describes a parallel plate heat sink used in conjunction with an air moving device which provides an annular flow of air against the heat sink. A flow deflector selectively blocks potential exhaust paths so as to redirect some of the flow of air through the region under the central hub of the fan. This transforms some of the otherwise stagnant air volume in the center of the heat sink to more rapidly moving cooling air.

An improved cooling system is desired.

SUMMARY OF THE INVENTION

One aspect of the present invention is a cooling system, comprising a heat sink having a plurality of fins, a fan positioned near the heat sink to blow air between the fins, and flow converging means positioned between the fins and the fan, to cause air from the fan to converge on a predetermined region of the heat sink.

Another aspect of the invention is a cooling system, including a heat sink having a plurality of fins. A fan is positioned near the heat sink to blow air between the fins. A flow converging device is provided from the group consisting of a plurality of wedges and a body having a frustum shaped opening therethrough. The flow converging device is positioned between the fins and the fan, to cause air from the fan to converge on a predetermined region of the heat sink.

Another aspect of the invention is a method for cooling a device, comprising the steps of: generating an air flow having an outer region with a first flow velocity and an inner region with a second flow velocity less than the first flow velocity; directing the air flow through a converging device, so the air flow from the outer region is converged into the inner region; and directing the converged air flow between a plurality of fins on a predetermined region of a heat sink.

BRIEF DESCRIPTION OF THE DRAWINGS

These and other features and advantages of the present invention is more fully disclosed in the following detailed description of the preferred embodiments of the invention, which are to be considered together with the accompanying drawings wherein like numbers refer to like parts and further wherein.

DETAILED DESCRIPTION

Figure 1:
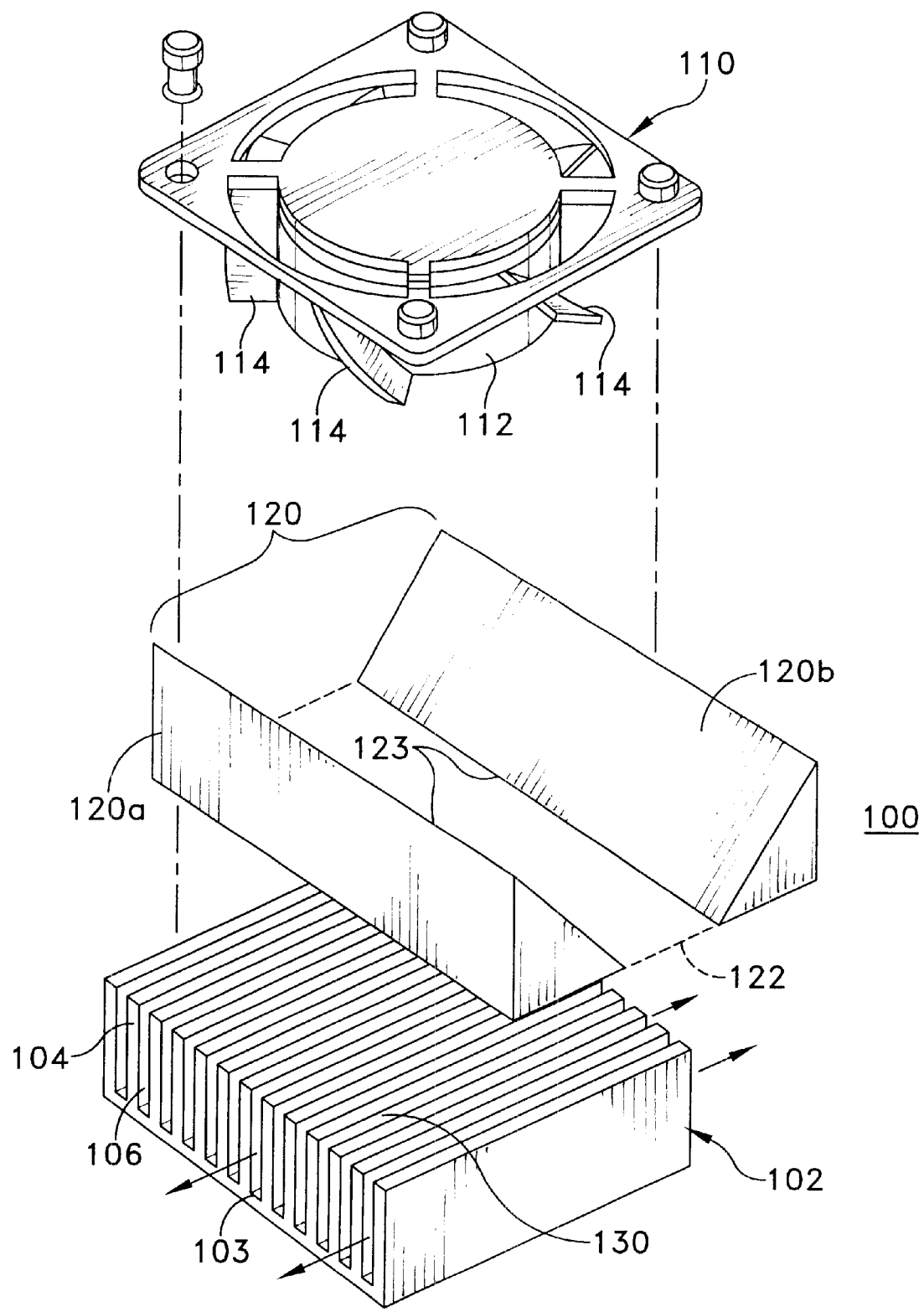
FIG. 1 is an isometric exploded view of a first exemplary cooling system according to the invention.

This description of the preferred embodiments is intended to be read in connection with the accompanying drawings, which are to be considered part of the entire written description of this invention. In the description, relative terms such as "lower," "upper," "horizontal," "vertical,", "up," "down," "top" and "bottom" as well as derivative thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

An exemplary method for cooling a device according to the present invention comprises the steps of: generating an air flow having an outer region with a first flow velocity and an inner region with a second flow velocity less than the first flow velocity; directing the air flow through a converging device, so the air flow from the outer region is converged into the inner region; and directing the converged air flow between a plurality of fins on a predetermined region of a heat sink. The generating step may include, for example, rotating at least one fan blade about a central hub of a fan. The converging device may be any of the converging devices described below, or equivalents thereof.

Figure 2:
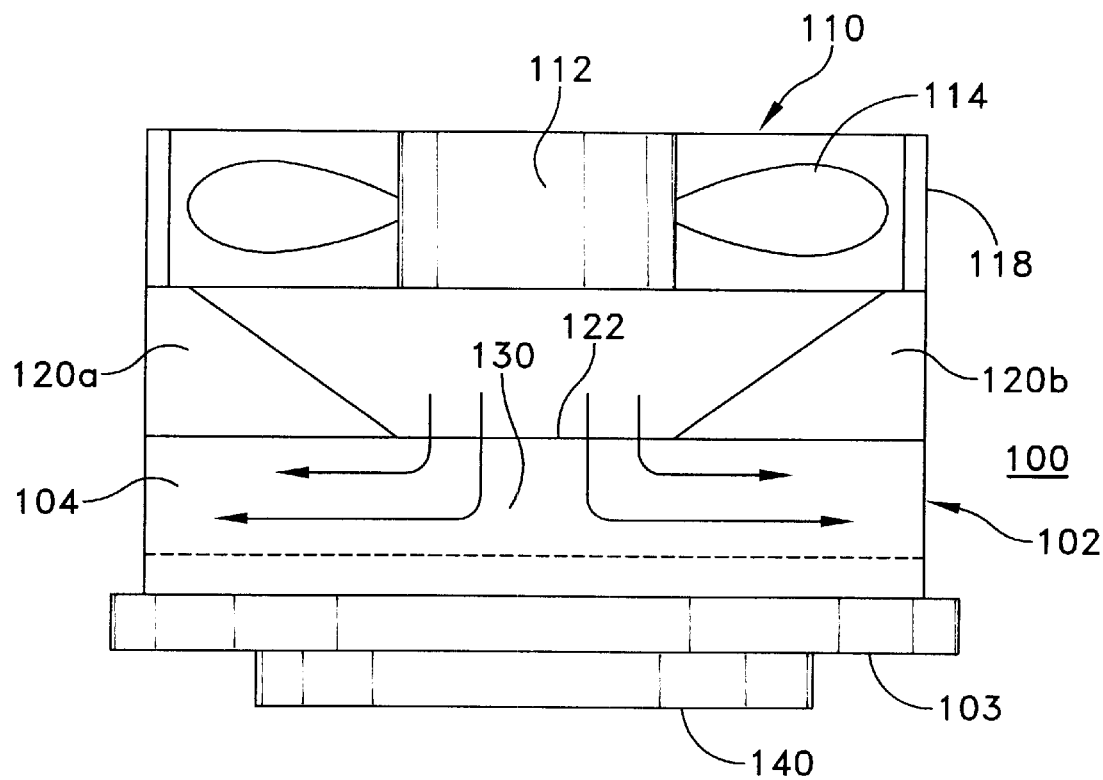
FIG. 2 is an end elevation view of the system of FIG. 1.

FIG. 1 is an isometric view of an exemplary cooling system 100 according to the present invention, and FIG. 2 is an end elevation view of the system. The system includes a heat sink 102 having a base plate 103 and a plurality of parallel plate fins 104, with a respective channel 106 between each pair of adjacent plate fins. A heat source 140 (shown in FIG. 2) beneath the heat sink 102 conducts heat to the heat sink. The heat 30 source may be an electrical device, or other type of heat source, such as the condenser of a heat pipe (which in turn has its evaporator coupled to a heat generating device. A fan 110 is positioned near the heat sink 102 to blow air into the channels 106 between the fins 104. The fan has 110 has a central hub 112 and at least one blade 114 attached to the hub.

A flow converging means 120 is provided. In the embodiment of FIG. 1, the flow converging means 120 includes a plurality of wedges 120*a*, 120*b*. The flow converging means 120 is positioned between the fins 104 and the fan 110, to cause air from the fan to converge on a predetermined region 130 of the heat sink 102. The region 130 is preferably substantially smaller in area than the entire area of the heat sink 102. In the embodiment of FIG. 1, the predetermined region 130 of the heat sink 102 is the center of the heat sink 102.

More specifically, in the embodiment of FIGS. 1 and 2, the opening 122 between the wedges 120*a*, 120*b* is in the shape of a rectangle having two sides 123 thereof perpendicular to the parallel plate fins 104. The converged air may thus be concentrated in the rectangular opening 122 that cuts across the centers of all of the channels 106 between consecutive pairs of fins 104.

The center portion of the rectangular opening 122 lies directly beneath the central hub 112 of the fan 110. Thus, the flow converging means 120 directs a portion of the flow into a region 130 that would otherwise receive little or no airflow. The air in each channel enters from the top in the center and is forced out through both ends.

As shown in FIG. 2, the flow converging device 120 may be formed of two pieces 120*a*, 120*b* attached to a housing or shroud 118 that connects the fan 110 to the heat sink 102. (The shroud or housing 118 is omitted from FIG. 1 solely to allow an easier view of the fan.) Alternatively, the flow converging device 120 may be integrally formed as part of the shroud or housing 118. If the housing 118 and the flow converging device 120 are both made of the same material (e.g., plastic), then they can be formed together in one part, for example, by injection molding. Still another alternative includes a flow converging device 120 integrally attached to the heat sink.

For a symmetrical heat sink, heat is dissipated most efficiently if the predetermined region 130 on which the air is blown and the heat source 140 (FIG. 2) are both located at the center of the heat sink 102. More generally, the region 130 is preferably beneath the center hub 112 of the fan 110, which should be located over the heat source 140.

In some alternative configurations (not shown), it is possible for center hub 112 and the heat source 140 to be offset from the center of the heat sink 102. For example, the heat source may be a device having hot spots that are not located at the center. For such configurations, it may be desirable to locate the opening 122 at a position offset from the center, so that the airflow is directed to the portion of the heat sink 102 directly above these hot spots. For a parallel plate fin type heat sink, the opening between the wedges is preferably an elongated rectangle having its longer dimension perpendicular to the fins. This opening can, however, be laterally offset along the length of the fins to accommodate a hot spot effectively. The width of the bottom of each wedge can be sized to locate the rectangular opening at any desired offset from the center of the heat sink. In that case, wedges 120*a* and 120*b* would not be identical to each other.

Figure 5:
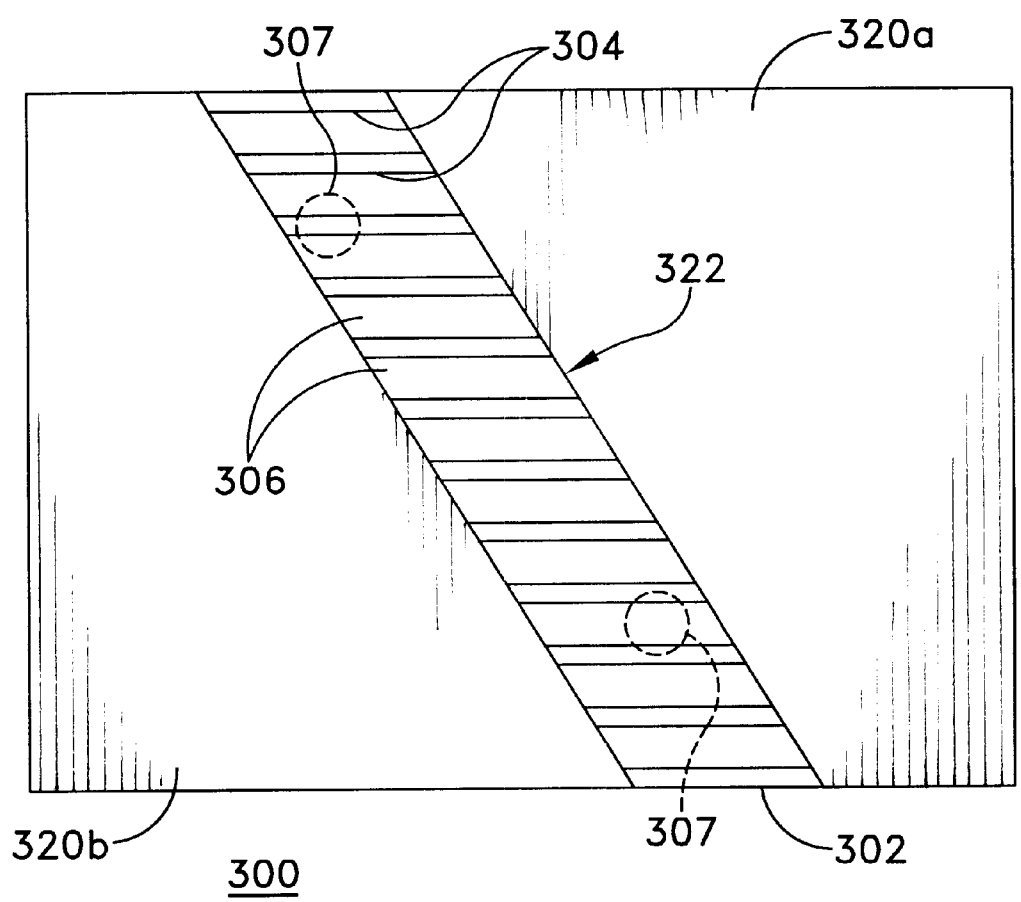
FIG. 5 is a plan view of a variation of the converging means of FIG. 1.

In another alternative configuration 300 (shown in FIG. 5), the opening 322 between the wedges 320*a*, 320*b* may be a parallelogram that cuts diagonally across the direction of the parallel plate fins 304. That is, the long sides of the parallelogram 322 are neither parallel to the fins 304 nor perpendicular to the fins, but still extend over all of the channels 306 between fins. The configuration of FIG. 5 allows the converged air flow to directly impinge on portions 307 of the heat sink that lie over a plurality of hot spots on the circuit (not shown) beneath the heat sink. Although the parallelogram 322 in FIG. 5 has its centroid approximately over the centroid of the heat sink, the parallelogram may be offset so as to blow air directly onto assymetrically positioned portions of the heat sink 302.

More complex configurations of the converging means are contemplated. By using curved surfaces on the two wedges (not shown), it is possible to construct an elongated opening that is curved to lie over three or more hot spots on the heat sink 102, while still crossing over all of the channels 106 in the heat sink.

Although the configuration of FIGS. 1 and 2 only include two wedges, 120*a* and 120*b*, other configurations of wedges may be used. For example, additional wedges may be provided at the ends of wedges 120*a*, 120*b*, to reduce the length of the rectangular opening. This smaller opening would concentrate air in a smaller central region, which may be advantageous in a heat sink with pin fins. It is understood that at least some of the wedges may be mitered to fit such a configuration, resulting in an opening shaped like a truncated pyramid.

In alternative configurations, the opening does not have to extend over all of the channels 106 between fins 104. It is understood that such configurations will not distribute the converged air through all of the channels.

Figure 4:
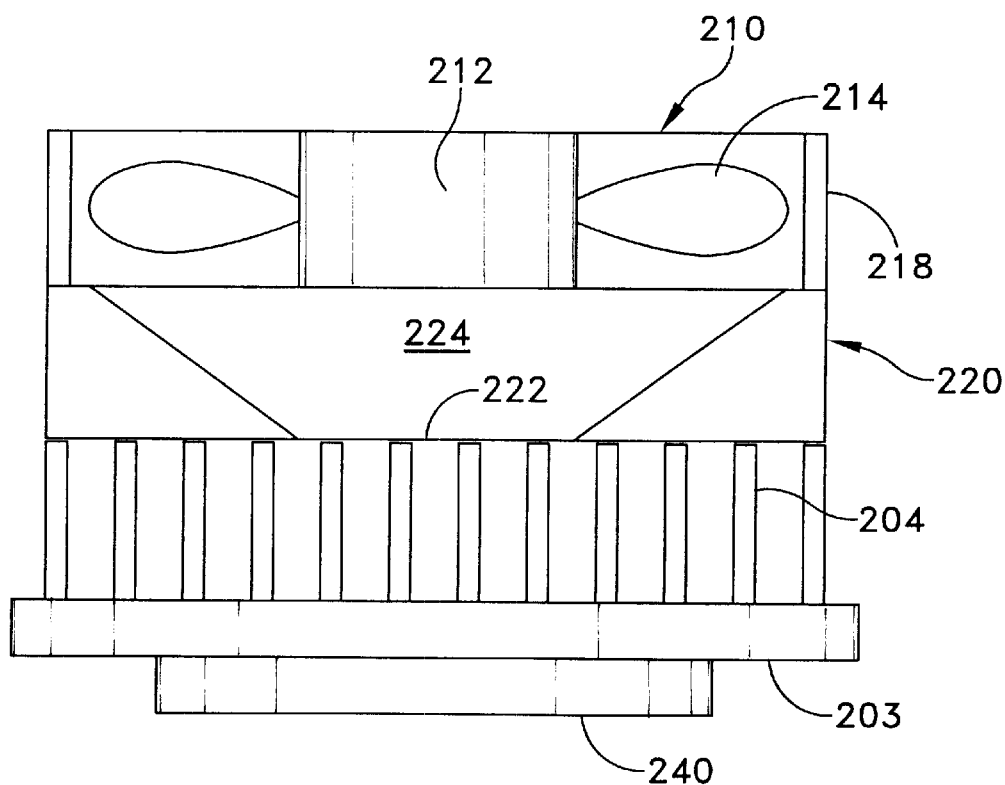
FIG. 4 is an end elevation view of the system of FIG. 3.
Figure 3:
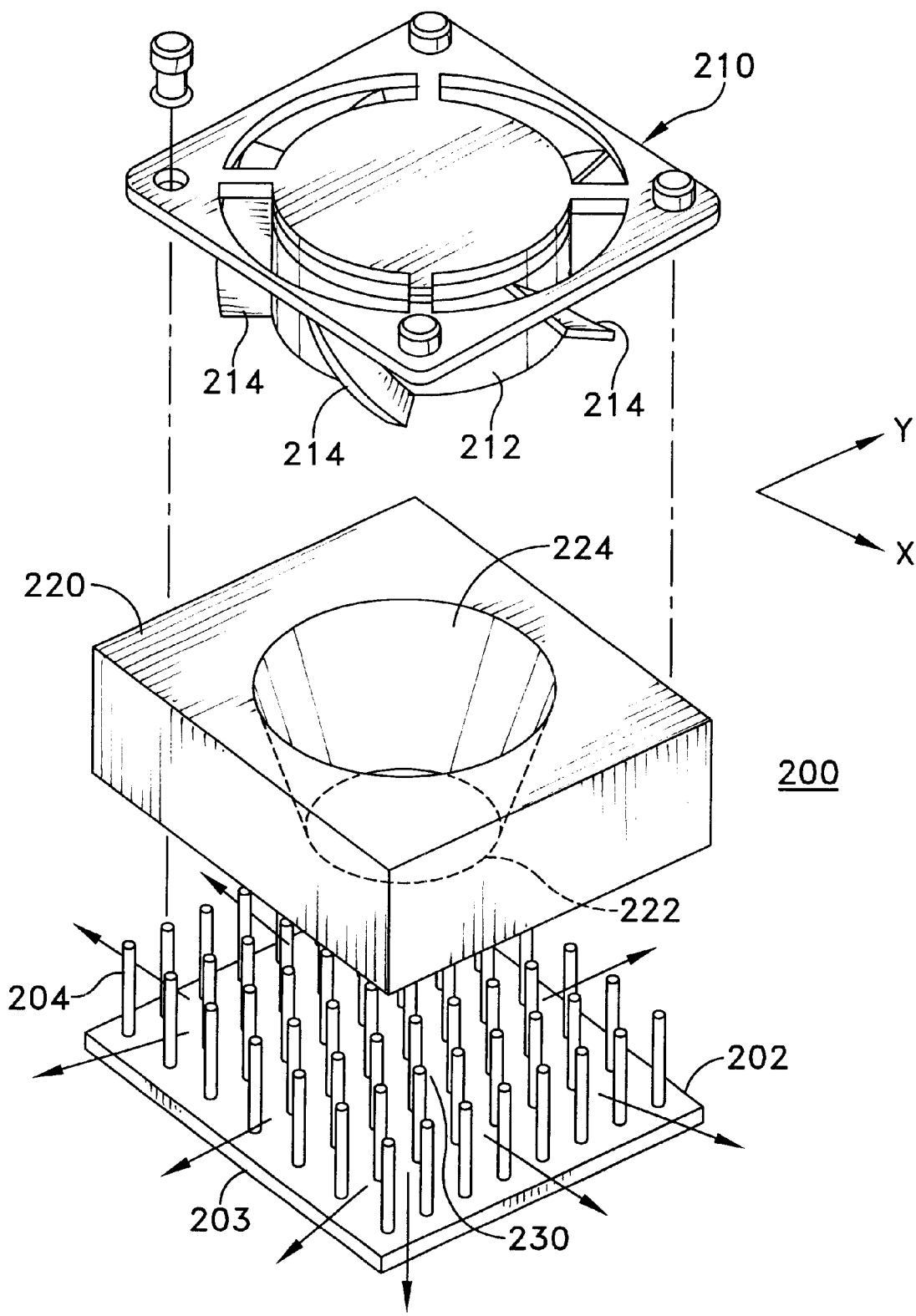
FIG. 3 is an isometric exploded view of a second exemplary cooling system according to the invention.

FIGS. 3 and 4 show another system 200 according to the invention. The heat sink 202 in system 200 has pin fins 204, allowing air to flow around the fins in all directions (indicated by arrows in FIG. 3). In system 200, the flow converging means include a body 220 with a frustum (i.e., truncated cone) shaped opening 224 therethrough. The opening 224 is between the central hub 212 and the region 230 of the heat sink 202.

As in system 100, the fan 210 has a central hub 212 and at least one blade 214 attached to the hub. The frustum shaped opening 224 is positioned between the hub 212 and the pin fins 204 located in the predetermined region 230 of the heat sink 202. The opening 224 has a circular cross section in any plane parallel to the base 203 of the heat sink 202.

Because the pin fin heat sink configuration allows egress of air in all directions, it is possible to use a converging means 220 that directs the air flow into a smaller region, centered (in both X and Y directions in FIG. 3) over the heat sink 202.

In system 200, the fan 110 has a shroud 218, to which the flow converging means 220 are attached.

Although the opening 224 shown in FIG. 3 is a circular frustum, the opening may alternatively be an elliptical frustum, i.e., an opening in which a cross section in any plane parallel to the base 203 of the heat sink 202 is an ellipse. An ellipse may be desirable, because it is narrower near the edge of the heat sink 202, and concentrates more air flow near the center of the heat sink. Other shapes that are narrower near the edges of the heat sink than at the center may alternatively be used.

Alternatively, the opening may be any converging passage, such that the cross section in any plane closer to the heat sink is smaller than any cross section further from the heat sink. The opening may be an ovate (egg-shaped) opening. The opening may even be an irregular, asymmetrical opening. Preferably, the opening has a smooth inner wall, with at most a limited number of discontinuities in the slope of the wall. It is understood that a stepped passage could be used, but such a passage would have stagnant regions and reduced air flow.

Although the opening 224 in converging means 220 is centered, it is contemplated that the opening may be offset from the center. For example, the opening 224 may be positioned over a hot spot. It is also contemplated that a plurality of frustum shaped openings may be positioned over two or more locations on the heat sink.

The exemplary embodiments described above direct a converged fast-flowing air stream toward the region in which the most heat is dissipated by the heat source. This improves the effectiveness of the heat sink as measured by a reduction in its thermal resistance.

As an alternative to improved thermal performance, the methods described above permit reduction in the mass of material in the heat sink without raising the temperature of the device to be cooled. The height and/or thickness of the fin material can be reduced without reducing the overall thermal resistance. By focusing the converged air flow on the hottest region(s) of the heat sink, less heat spreading is required through the base plate of the heat sink to keep the device being cooled below its maximum temperature. Thus, the thickness of the base plate can be reduced, reducing the mass of the heat sink. This can in turn reduce stress on the device (e.g., CPU) by the heat sink. Further, because the fin height can be reduced, the flow converging means can be incorporated into existing designs without changing the overall dimensions of the heat sink/fan assembly.

Although the heat sinks in the embodiments described above include plate fins and pin fins, other types of fins may be used, including, but not limited to louvered fins, offset strip fins, and lanced fins.

Although the invention is described herein in terms of exemplary embodiments, it is not limited thereto. Rather, the appended claim should be construed broadly, to include other variants and embodiments of the invention, which may be made by those skilled in the art without departing from the scope and range of equivalents of the invention.

What is claimed is:

1. A cooling system, comprising:
   a heat sink having a plurality of fins;
   a fan positioned near the heat sink to blow air between the fins and including a central hub and at least one blade attached to the hub; and
   a flow converging device comprising a plurality of wedges each including an opening therebetween, the opening positioned between the hub and the fins located in the predetermined region of the heat sink, the flow converging device positioned between the fins and the fan, to cause air from the fan to converge on a predetermined region of the heat sink.

2. The cooling system of claim 1, wherein the fan has a central hub and at least one blade attached to the hub, the frustum shaped opening is positioned between the hub and the fins located in a central region of the heat sink.

3. The cooling system of claim 1, wherein the predetermined region of the heat sink has a heat source attached thereto.

4. The cooling system of claim 1, wherein the flow converging device is integrally attached to a housing that connects the fan to the heat sink.

5. The cooling system of claim 1 wherein the opening between the wedges is in the shape of a rectangle having two sides thereof perpendicular to the parallel plate fins.

6. The cooling system of claim 1, wherein the flow converging device is a body having a frustum shaped opening therethrough, and the heat sink has a plurality of pin fins.

7. The cooling system of claim 1, wherein the plurality of wedges have an opening therebetween, the opening being a parallelogram.

8. A cooling system, comprising:
   a heat sink having a plurality of parallel plate fins;
   a fan positioned near the heat sink to blow air between the fins wherein the fan has a shroud and a rotating central hub and at least one blade attached to the hub; and
   flow converging means attached to the shroud and positioned between the fins and the fan, to cause air from the fan to converge on a predetermined region of the heat sink wherein the flow converging means include a pair of wedges with an opening therebetween, the opening having two sides that cross the fins, the opening being between the central hub and the region of the heat sink, and the region has a heat source.

9. The cooling system of claim 8, wherein:
   the fins are pin fins;
   the fan has a rotating central hub and at least one blade attached to the hub, and the fan has a shroud, to which the flow converging means are attached; and
   the flow converging means include a body with a frustum shaped opening therethrough, the opening being between the central hub and the region of the heat sink.

10. A method for cooling a device, comprising the steps of:
    (a) rotating at least one fan blade about a central hub of a fan so as to generate an air flow having an outer region with a first flow velocity and an inner region with a second flow velocity less than the first flow velocity;
    (b) directing the air flow through a converging device comprising a pair of wedges having an opening therebetween, so the air flow from the outer region is converged into the inner region; and
    (c) directing the converged air flow between a plurality of fins on a predetermined region of a heat sink wherein the opening positioned between the central hub and the predetermined region of the heat sink.

11. The method of claim 10 wherein the converging device is a body having a frustum-shaped opening therethrough, the opening positioned between the central hub and the predetermined region of the heat sink.

12. A method for cooling a device, comprising the steps of:
    (a) generating an air flow having an outer region with a first flow velocity and an inner region with a second flow velocity less than the first flow velocity;
    (b) directing the air flow through a converging device, so the air flow from the outer region is converged into the inner region; and
    (c) directing the converged air flow between a plurality of fins on a predetermined region of a heat sink and into a non-rectangular parallelogram shaped area that overlies at least one hot spot.

* * * * *